United States Patent
Lu et al.

(10) Patent No.: US 6,485,313 B1
(45) Date of Patent: Nov. 26, 2002

(54) BGA SOCKET WITH IMPROVED CONTACTS

(75) Inventors: Sidney Lu, Cupertino, CA (US); Nick Lin, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/023,635

(22) Filed: Dec. 17, 2001

(51) Int. Cl.⁷ .............................................. H01R 12/00
(52) U.S. Cl. ......................................... 439/83; 439/342
(58) Field of Search ...................... 439/83, 876, 874, 439/875, 78, 342, 861, 259

(56) References Cited

U.S. PATENT DOCUMENTS

| | | | | |
|---|---|---|---|---|
| 5,746,608 A | * | 5/1998 | Taylor | ........................ 439/83 |
| 6,142,811 A | * | 11/2000 | Lin | .............................. 439/83 |
| 6,155,845 A | * | 12/2000 | Lin et al. | ....................... 439/83 |
| 6,217,348 B1 | * | 4/2001 | Lin et al. | ....................... 439/83 |

* cited by examiner

*Primary Examiner*—Hien Vu
(74) *Attorney, Agent, or Firm*—Wei Te Chung

(57) ABSTRACT

A BGA socket (1) comprises a base (20) defining a plurality of contact passageways (21), a plurality of contacts (30) received in the contact passageways, and a cover (10) movably mounted on the base. Each contact has a fitting portion (31) fixedly engaging with the base, a contact portion (32) formed above the fitting portion for engaging with a pin of an IC module, and a contact pad (33) below the fitting portion for being soldered to a printed circuit board. The bottom surface (331) of the contact pad has a plurality of bumps (332). A solder ball (34) is soldered to the bottom surface of the contact pad and bonded with the bumps.

1 Claim, 4 Drawing Sheets

BGA SOCKET WITH IMPROVED CONTACTS

BACKGROUND OF THE INVENTION

1. Field of the Invention

The present invention relates to a Ball Grid Array (BGA) socket, and particularly to a BGA socket contact having an improved contact pad for securing a solder ball in position.

2. Description of Related Art

BGA sockets are well known in the art for reliably connecting an integrated circuit (IC) module to a circuit board. Such BGA sockets are disclosed in U.S. Pat. Nos. 6,099,321 and 6,062,890. The conventional BGA socket consists of a base, a cover movably mounted on the base, and a plurality of conductive contacts received in the base. The conductive contacts are fitted in contact passageways defined in the base and each comprises a contact pad oriented parallel to the base. After being mounted to the base, each contact is attached with a solder ball at a bottom surface thereof. The solder balls are secured to the contacts pads in advance, and are adapted to electrically and mechanically connect the contacts of the socket to a printed circuit board (PCB) on which the socket is mounted when the socket and the PCB are together subject to a reflow process. Although the conventional BGA socket has proven to work well, disadvantages exist which need to be addressed. Referring to FIGS. 4A and 4B, the bottom surface 91 of the contact pad 9 of a conventional BGA contact is flat or has only one dimple 92 formed therein. After the solder ball 8 is attached on the contact pad 9, the solder joint between the solder ball 8 and the contact pad 9 is not reliable enough to sustain an external shearing force. Thus, the solder ball 8 may be damaged and even broken off during assembly and/or transportation, thereby adversely affecting the electrical capability of the whole socket.

Hence, a BGA socket with improved contacts is required to overcome the disadvantages of the prior art.

SUMMARY OF THE INVENTION

An object of the present invention is to provide a BGA socket with an improved contacts for securing solder balls in position.

Another object of the present invention is to provide a contact with an improved contact pad.

In order to achieve the objects set forth, a BGA socket for electrically interconnecting an IC module and a circuit board in accordance with the present invention comprises a base defining a plurality of contact passageways, a plurality of contacts received in the contact passageways, and a cover movably mounted on the base and defining a plurality of receiving holes for receiving corresponding pins of the IC module. Each contact has a fitting portion fixedly engaging with the base, a contact portion formed above the fitting portion for engaging with a corresponding pin of the IC module, and a contact pad below the fitting portion for being soldered to the circuit board. The bottom surface of the contact pad has a plurality of bumps. A solder ball is soldered to the contact pad by soldering with the bottom surface of the contact pad and the bumps.

Other objects, advantages and novel features of the invention will become more apparent from the following detailed description when taken in conjunction with the accompanying drawings.

DETAILED DESCRIPTION OF THE INVENTION

Figure 1:
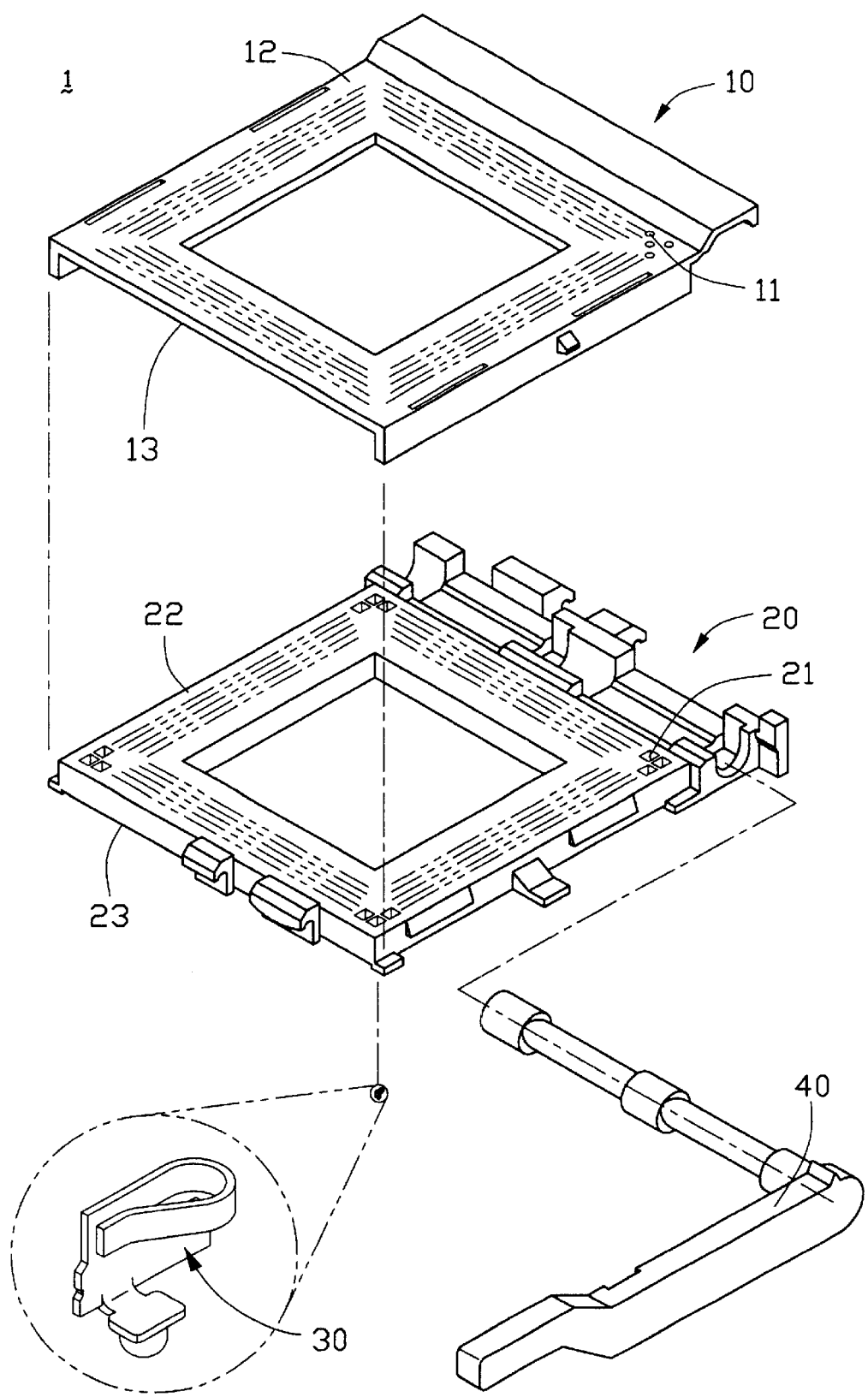
FIG. 1 is an exploded perspective view of a BGA socket incorporating contacts in accordance with the present invention.

Reference will now be made to the drawing figures to describe the present invention in detail.

Referring to FIG. 1, an exemplary BGA socket 1 is shown comprising a cover 10, a base 20, an actuation mechanism 40, and a plurality of conductive contacts 30 in accordance with the present invention. The cover 10 has a substantially rectangular shape and defines a plurality of pin holes 11 through upper and lower surfaces 12, 13 for receiving pins of an IC module (not shown). The base 20 also has a substantially rectangular shape and defines a plurality of contact passageways 21 through upper and lower faces 22, 23 thereof for receiving the contacts 30. The cover 10 is movably mounted on the base 20 and the actuation mechanism 40 drives the cover 10 to slide on the base 20.

Figure 2:
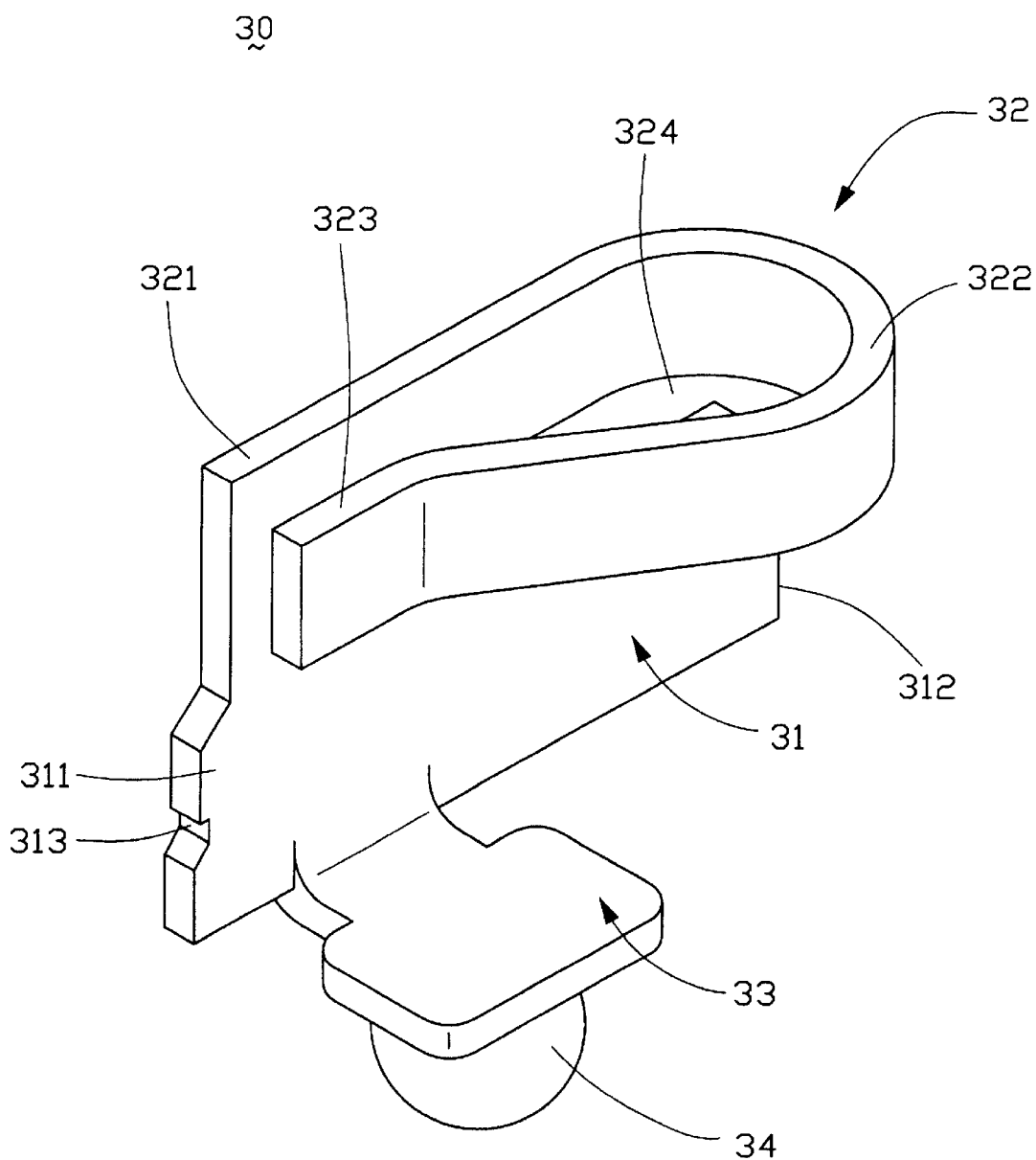
FIG. 2 is a perspective view of the contact of the BGA socket shown in FIG. 1.

Referring to FIG. 2, each conductive contact 30 is formed by stamping a metal sheet and comprises an elongated plate-like fitting portion 31 having two barbs 311 projecting from each of first and second lateral sides 312, 313 thereof for interferentially engaging with the base 20 when the contact 30 is mounted in the corresponding contact passageway 21. A contact portion 32 is formed above the fitting portion 31 and has a fixed contacting section 321 just above the fitting portion 31 near the second lateral side 313 thereof, an arcuate section 322 extending from the fixed contacting section 321 firstly toward the first lateral side 312 and then back toward the second lateral side 313, and a free end functioning as a movable contacting section 323 which is spaced from the fixed contacting section 321 a distance. The fitting portion 31 and the contact portion 32 constitute a main body of the contact 30. The arcuate section 322 and the fixed and movable contacting sections 321, 323 are located at the same level whereby the contact 30 has a relatively small height to enable the socket 1 to have a reduced profile. The arcuate section 322 functions to provide a spring force to the movable contacting section 323 of the contact 30 to clamp the corresponding pin of the IC module inserted into the BGA socket 1. The arcuate section 322 defines a pin receiving space 324 therein. A contact pad 33 perpendicularly extends from a lower edge of the fitting portion 31 near the second lateral side 313.

Figure 3A:
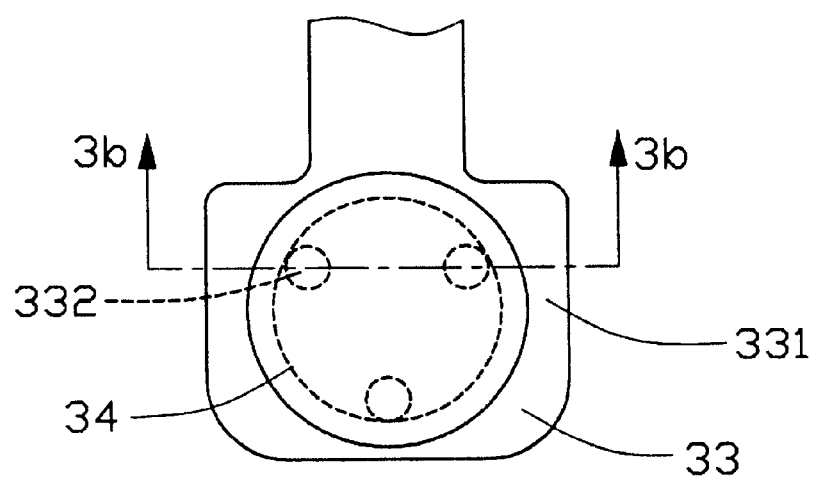
FIG. 3A is a bottom view of a contact pad of the contact shown in FIG. 2 with a solder ball soldered thereto.
Figure 3B:
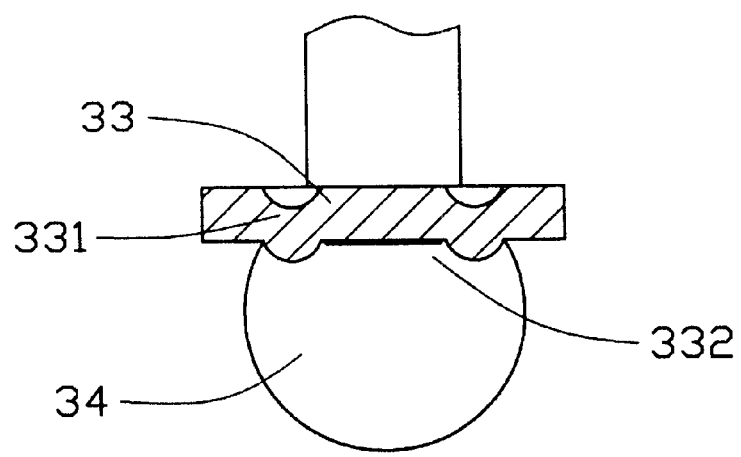
FIG. 3B is a cross-sectional view of the contact pad taken along line 3b–3b in FIG. 3A.
Figure 4A:
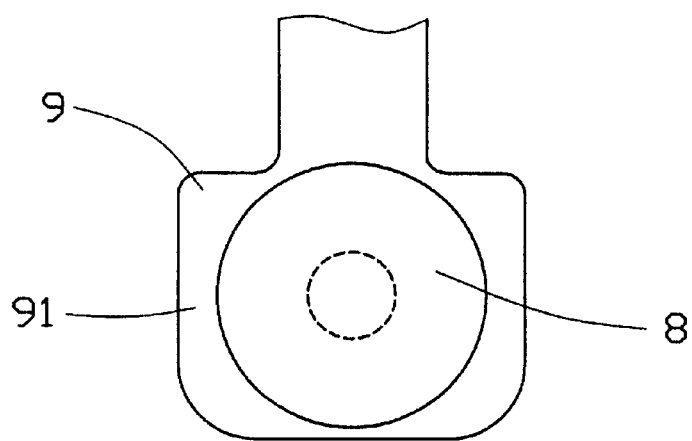
FIG. 4A is a bottom view of a contact pad of a conventional BGA socket contact.
Figure 4B:
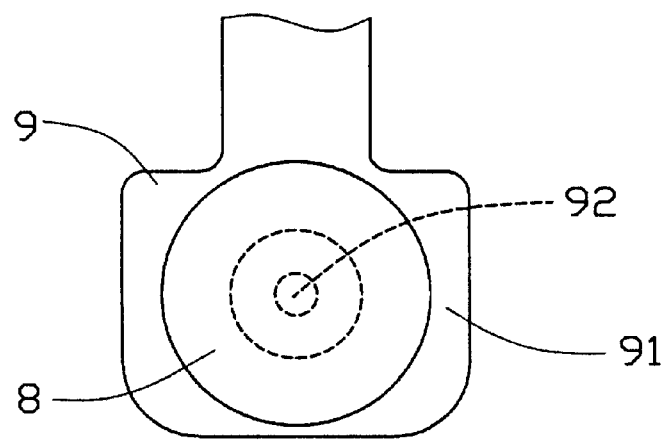
FIG. 4B is a bottom view of a contact pad of another conventional BGA socket contact.

Referring to FIGS. 3A and 3B, The contact pad 33 is punched to form three equidistant bumps 332 around a center portion of a bottom surface 331. The contact 30, after being mounted to the BGA socket 1, is attached with a solder ball 34 at the bottom surface 331. The solder ball 34 is bonded with the bumps 332 after reflowing. The solder ball 34 is then melted and solidified to electrically and mechanically connect the contact 30 to a printed circuit board (not shown) on which the socket 1 is mounted when the socket 1 and the PCB are together subject to a reflow process.

To assemble the socket 1 in accordance with the present invention, the conductive contacts 30 are fitted into the corresponding contact passageways 21 of the base 20. Thereafter, the actuation mechanism 40 is assembled in the base 20 and the cover 10 is pressed onto the base 20.

By the provision of the bumps 332 on the contact pad 331 of each contact 33, the solder ball 34 is placed on the center portion of the contact pad 331 before soldering and the solder joint between the solder ball 34 and the contact pad 331 is significantly enhanced after soldering since the solder ball 34 and the bumps 332 are bonded together. Therefore, breakage of the solder ball 34 from the contact pad 331 can be effectively prevented even when the solder ball 34 is subject to a significant external shearing force. It should be noted that the number of the bumps 332 on the contact pad 33 may be more than three to perform a same or better function.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical socket for electrically interconnecting an integrated circuit (IC) module and a circuit board, comprising:
   - a base defining a plurality of contact passageways;
   - a cover movably mounted on the base and defining a plurality of receiving holes in alignment with the contact passageways for receiving corresponding pins of an IC module; and
   - a plurality of contacts received in the contact passageways, each contact having a fitting portion engaged with the base, a contact portion formed above the fitting portion for engaging with a corresponding pin of the IC module, a contact pad formed below the fitting portion and extending perpendicularly from the fitting portion for being soldered to a printed circuit board, the contact pad having at least three bumps formed on a bottom surface thereof, and a solder ball soldered to the bottom surface and the at least three bumps of the contact pad; wherein
   the at least three bumps are formed around a center portion of the contact pad of each contact.

* * * * *